United States Patent
Xie et al.

(10) Patent No.: US 11,314,115 B2
(45) Date of Patent: Apr. 26, 2022

(54) ARRAY SUBSTRATE AND MANUFACTURING METHOD THEREFOR, DISPLAY PANEL AND DISPLAY DEVICE

(71) Applicants: ORDOS YUANSHENG OPTOELECTRONICS CO., LTD., Inner Mongolia (CN); BOE TECHNOLOGY GROUP CO., LTD., Beijing (CN)

(72) Inventors: Yang Xie, Beijing (CN); Weixin Meng, Beijing (CN); Jian Guo, Beijing (CN)

(73) Assignees: ORDOS YUANSHENG OPTOELECTRONICS CO., LTD., Inner Mongolia (CN); BOE TECHNOLOGY GROUP CO., LTD., Beijing (CN)

(*) Notice: Subject to any disclaimer, the term of this patent is extended or adjusted under 35 U.S.C. 154(b) by 602 days.

(21) Appl. No.: 16/319,617
(22) PCT Filed: Jun. 5, 2018
(86) PCT No.: PCT/CN2018/089926
§ 371 (c)(1),
(2) Date: Jan. 22, 2019
(87) PCT Pub. No.: WO2018/223953
PCT Pub. Date: Dec. 13, 2018

(65) Prior Publication Data
US 2021/0311349 A1    Oct. 7, 2021

(30) Foreign Application Priority Data
Jun. 5, 2017    (CN) .......................... 201710413217.9

(51) Int. Cl.
H01L 27/32    (2006.01)
H01L 51/52    (2006.01)
(Continued)

(52) U.S. Cl.
CPC .. *G02F 1/133345* (2013.01); *G02F 1/133357* (2021.01); *G02F 1/133553* (2013.01);
(Continued)

(58) Field of Classification Search
CPC ......... G02F 1/133345; G02F 1/133788; G02F 1/133553; G02F 1/133357;
(Continued)

(56) References Cited

U.S. PATENT DOCUMENTS

2002/0131003 A1    9/2002    Matsumoto
2013/0106746 A1    5/2013    Lai et al.
(Continued)

FOREIGN PATENT DOCUMENTS

CN    202794786 U    3/2013
CN    203164563 U    8/2013
(Continued)

OTHER PUBLICATIONS

International Search Report and Written Opinion dated Aug. 15, 2018; PCT/CN2018/089926.

*Primary Examiner* — Kyoung Lee

(57) ABSTRACT

An array substrate, a manufacturing method of the same, a display panel and a display device are provided. The array substrate includes a display region and a peripheral region around the display region, a photosensitive layer is in the display region and a peripheral circuit is in the peripheral region. The array substrate further includes an alignment film covering the photosensitive layer and the peripheral circuit. The array substrate further includes an insulating layer between the peripheral circuit and the alignment film. The alignment film is a photo alignment film, and the insulating layer is configured to absorb and/or reflect an alignment light adopted for performing photoalignment to obtain the alignment film.

15 Claims, 2 Drawing Sheets

(51) Int. Cl.
    *G02F 1/1333*     (2006.01)
    *G02F 1/1362*     (2006.01)
    *G02F 1/1335*     (2006.01)
    *G02F 1/1337*     (2006.01)
    *H01L 51/56*     (2006.01)

(52) U.S. Cl.
    CPC .. *G02F 1/133788* (2013.01); *G02F 1/136222* (2021.01); *H01L 27/322* (2013.01); *H01L 27/3244* (2013.01); *H01L 51/5246* (2013.01); *H01L 51/56* (2013.01); *H01L 2227/323* (2013.01)

(58) Field of Classification Search
    CPC ............. G02F 1/136222; H01L 27/322; H01L 27/3244; H01L 51/5246; H01L 51/56; H01L 2227/323
    See application file for complete search history.

(56) References Cited

U.S. PATENT DOCUMENTS

2015/0131041 A1*   5/2015   Moriwaki ......... G02F 1/133345
                                                          349/106
2017/0205647 A1    7/2017   Feng et al.

FOREIGN PATENT DOCUMENTS

| CN | 103926739 A | 7/2014 |
| --- | --- | --- |
| CN | 104570461 A | 4/2015 |
| CN | 106990618 A | 7/2017 |

\* cited by examiner

ARRAY SUBSTRATE AND MANUFACTURING METHOD THEREFOR, DISPLAY PANEL AND DISPLAY DEVICE

This application claims the benefit of Chinese patent application No. 201710413217.9 filed on Jun. 5, 2017, which is hereby entirely incorporated by reference as a part of the present application.

TECHNICAL FIELD

Embodiments of the present disclosure relate to an array substrate, a manufacturing method of the array substrate, a display panel including the array substrate, and a display device including the display panel.

BACKGROUND

At present, a thin film transistor type liquid crystal display panel has become a mainstream product in the display field. The liquid crystal display panel includes an array substrate and an opposite substrate, and each of the array substrate and the opposite substrate is provided with an alignment film to provide an initial orientation for a liquid crystal material between the array substrate and the opposite substrate.

SUMMARY

According to embodiments of the present disclosure, an array substrate is provided. The array substrate includes a display region and a peripheral region around the display region, a photosensitive layer is in the display region, a peripheral circuit is in the peripheral region, the array substrate further includes an alignment film, and the alignment film covers the photosensitive layer and the peripheral circuit. The array substrate further includes an insulating layer that is between the peripheral circuit and the alignment film, the alignment film is a photo alignment film, and the insulating layer is configured to absorb and/or reflect an alignment light adopted for performing photoalignment to obtain the alignment film.

For example, the insulating layer includes an insulating base and a reflective structure that a surface of the insulating base is provided with, the insulating base is configured to absorb one portion of the alignment light, and the reflective structure is configured to reflect the other portion of the alignment light.

For example, the reflective structure includes a recess in the surface of the insulating base; or the reflective structure includes a protrusion on the surface of the insulating base.

For example, the insulating layer is formed of a red color filter material.

For example, the display region further includes a red color filter layer, and the insulating layer and the red color filter layer are in a same layer and are formed of a same red color filter material.

For example, the insulating layer is in the peripheral region only.

For example, the display region is further provided with a display circuit, the photosensitive layer covers the display circuit and the photosensitive layer is a planarization layer.

According to the embodiments of the present disclosure, a manufacturing method of the array substrate is provided. The manufacturing method includes: providing a base substrate includes a display region and a peripheral region around the display region, in which a photosensitive layer is in the display region, and a peripheral circuit is in the peripheral region; forming an insulating layer on the peripheral circuit; forming an alignment material layer on the base substrate provided with the insulating layer; and obtaining an alignment film by irradiating the alignment material layer with an alignment light, in which the alignment film covers the photosensitive layer and the peripheral circuit, and the insulating layer absorbs and/or reflects the alignment light.

For example, the forming the insulating layer on the peripheral circuit includes: forming an insulating material layer on the peripheral circuit; patterning the insulating material layer to obtain the insulating layer, in which the insulating layer includes an insulating base and a reflective structure, the insulating base is configured to absorb one portion of the alignment light, and the reflective structure is configured to reflect the other portion of the alignment light.

For example, the reflective structure includes a recess in a surface of the insulating base; or the reflective structure includes a protrusion on the surface of the insulating base.

For example, the insulating layer is formed of a red color filter material.

For example, the display region further includes a red color filter layer, and the insulating layer and the red color filter layer are formed simultaneously.

For example, the insulating layer is in the peripheral region only.

For example, the display region is further provided with a display circuit, the photosensitive layer covers the display circuit and the photosensitive layer is a planarization layer.

According to the embodiments of the present disclosure, a display panel is provided and includes the array substrate described as above.

According to the embodiments of the present disclosure, a display device is provided and includes the display panel described as above.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. "On," "under," "right," "left" and the like are only used to indicate relative position relationship, and when the position of the object which is described is changed, the relative position relationship may be changed accordingly.

There are two methods for preparing an alignment film, one is a rubbing alignment method, and the other is a photoalignment method. The alignment film obtained by the photoalignment method does not cause defects such as chippings and rubbing mura. Further, a display panel including the alignment film obtained by the photoalignment method has advantages such as high aperture ratio, high contrast and fast response speed.

However, in the display panel including the alignment film obtained by the photoalignment method, defects such as photo frame mura (i.e., a defect of being around the display region) may occur.

Figure 1:
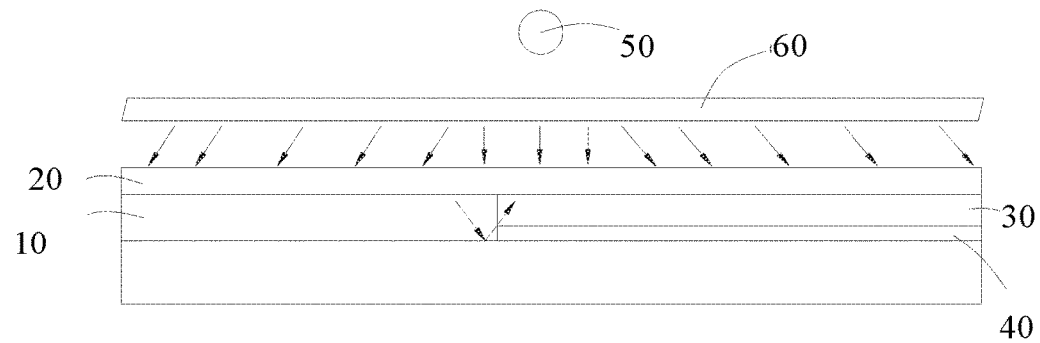
FIG. 1 is a partial structural view of an array substrate according to one technique.

The inventors of the present disclosure have found that the reason why the photo frame mura occurs in the display panel including the alignment film obtained by photoalignment is that: in the photoalignment process by using an alignment light irradiating the alignment film, a peripheral circuit reflects the alignment light to an edge of a photosensitive layer of the display region, causing damage to the edge of the photosensitive layer in the display region. For example, as shown in FIG. 1, the array substrate includes the display region and a peripheral region, the photosensitive layer 30 is in the display region, and the peripheral circuit 10 is in the peripheral region. In the preparation of the alignment film 20, an alignment material layer is firstly provided, a polarizer 60 is disposed over the alignment material layer and is irradiated with an ultraviolet light source 50, ultraviolet light from the ultraviolet light source 50 passes through the polarizer 60 and reaches the alignment material layer to make material molecules in the alignment material layer align in a specific direction, and thus the alignment film 20 is formed. In the above process, a portion of the ultraviolet light passes through the alignment material layer and reaches the peripheral circuit 10. The peripheral circuit 10 includes a metal lead wire, and thus reflects the ultraviolet light irradiating onto the metal lead wire to the edge of the photosensitive layer 30. The photosensitive layer 30 for example is formed of a light-sensitive organic resin material, so the ultraviolet light reflected by the peripheral circuit 60 causes the damage to the edge of the photosensitive layer 30, which deteriorates a sealing performance of the photosensitive layer 30. In a high temperature and high humidity environment, water vapor easily permeates from the damaged edge of the photosensitive layer 30 and causes corrosion to a display circuit 40 below the photosensitive layer 30, and finally the photo frame mura forms.

Figure 2:
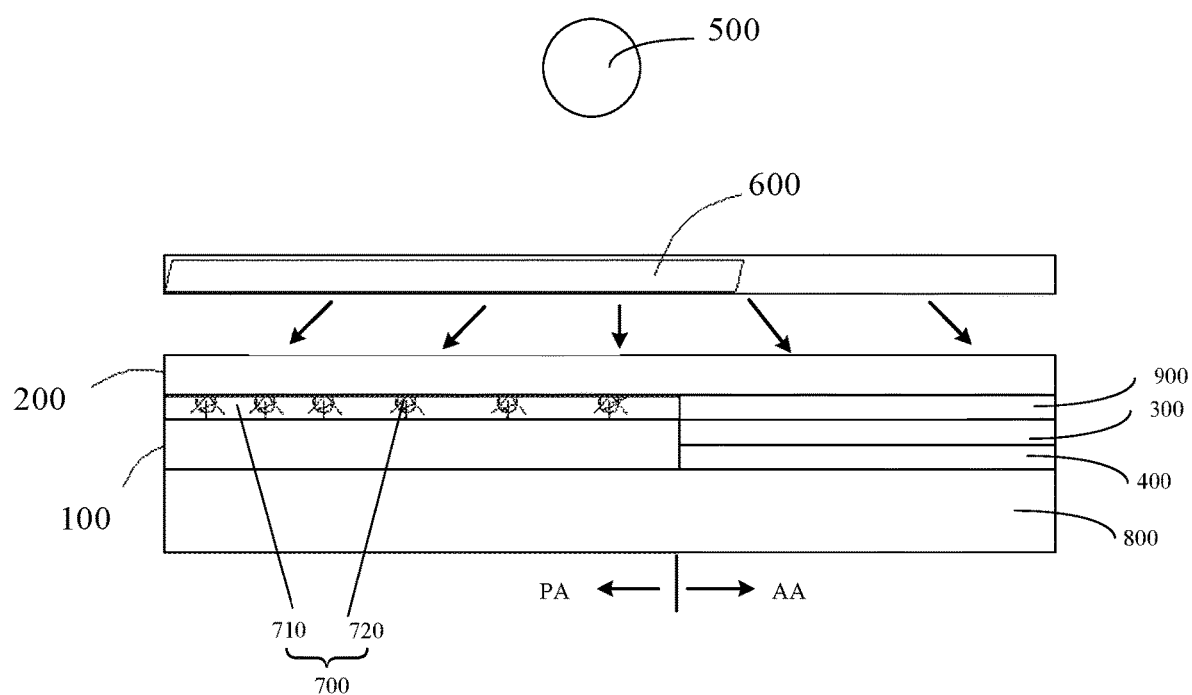
FIG. 2 is a partial structural schematic view of an array substrate according to embodiments of the present disclosure.
Figure 3:
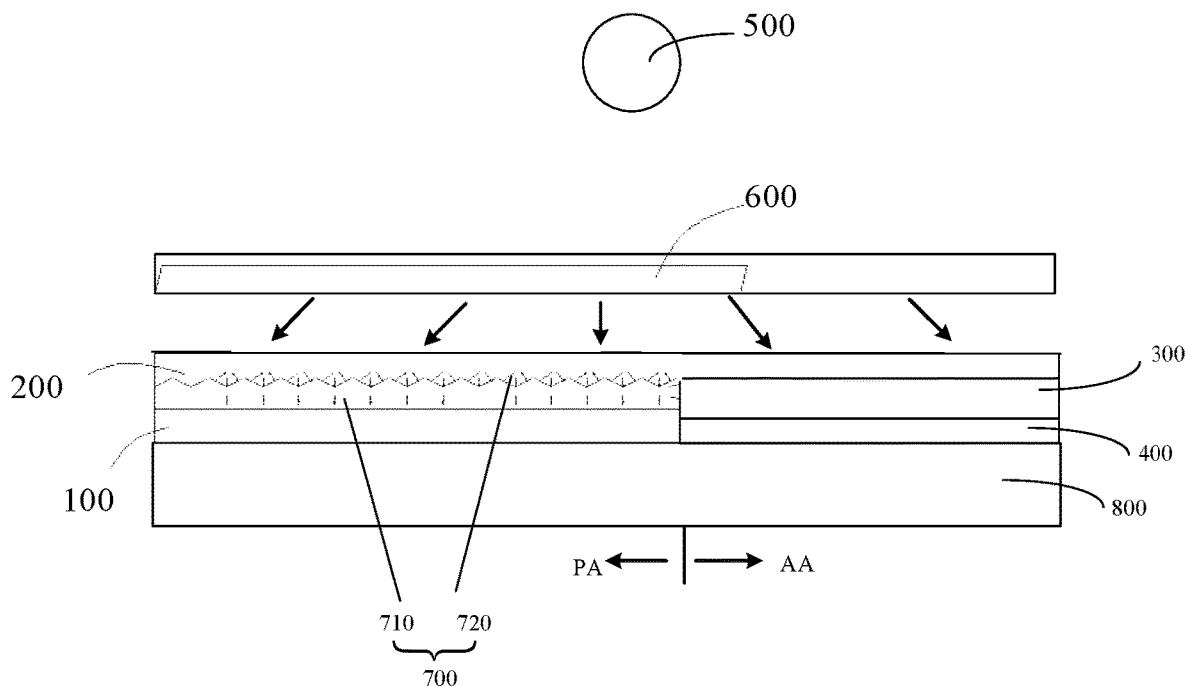
FIG. 3 is another partial schematic view of the array substrate according to the embodiments of the present disclosure.

Embodiments of the present disclosure provide an array substrate. As shown in FIG. 2 and FIG. 3, the array substrate includes a display region AA and a peripheral region PA around the display region, a photosensitive layer 300 is in the display region AA, a peripheral circuit 100 is in the peripheral region PA, and the array substrate further includes an alignment film 200 covering both the photosensitive layer 300 and the peripheral circuit 100. The array substrate further includes an insulating layer 700 between the peripheral circuit 100 and the alignment film 200, the alignment film 200 is a photo alignment film, and the insulating layer 700 is configured to absorb and/or reflect an alignment light adopted for performing photoalignment for obtaining the alignment film 200.

For example, the array substrate further includes a base substrate 800, and the above components are all on the base substrate 800.

For example, the insulating layer 700 being between the peripheral circuit 100 and the alignment film 200 means that, the insulating layer 700 is between the peripheral circuit 100 and the alignment film 200 in a direction perpendicular to the array substrate.

In the display region of the array substrate, insulating films for insulating different electrical components and a planarization layer for planarizing a portion of the array substrate in the display region are provided. These insulating films and the planarization layer, for example, are formed by a photosensitive resin, because there are many manufacturers supplying the photosensitive resin to make the supply of a raw material sufficient, and because the forming of these insulating films and the planarization layer by using the photosensitive resin is simple in process and less in material consumption. The photosensitive layer 300 as described above, for example, is any one of these insulating films and the planarization layer which are formed of the photosensitive resin. The planarization layer protects components (for example, a display circuit 400) in the display region of the array substrate in addition to planarizing the portion of the array substrate in the display region, so it is preferable that the photosensitive layer 300 is the planarization layer to effectively avoid the photo frame mura.

For example, the peripheral circuit 100 is any component that is in the peripheral region PA and includes a metal, such as a source driver circuit, a gate driver circuit, a shift register, a lead wire, a pad, and the like, which is not limited in the embodiments of the present disclosure.

For example, the insulating layer 700 covers an entirety of the peripheral circuit 100, that is, an orthographic projection of the peripheral circuit 100 on the base substrate 800 is in an orthographic projection of the insulating layer 700 on the base substrate 800.

For example, the insulating layer 700 is in the peripheral region PA only, that is, the insulating layer 700 is not in the display region AA, so as to ensure the display performance of the display region AA.

According to the embodiments of the present disclosure, in performing the photoalignment on an alignment material layer to form the alignment film 200, the alignment light passing through the alignment material layer is absorbed and/or reflected by the insulating layer 700 without reaching the peripheral circuit 100, and thus does not reach an edge of the photosensitive layer 300 (for example, the planarization layer), so that the edge of the photosensitive layer 300 is not affected by the alignment light, thereby ensuring a good sealing performance and preventing the permeation of the water vapor. Therefore, the defects such as the photo frame mura do not occur in the display panel including the array substrate.

According to the embodiments of the present disclosure, as shown in FIG. 2 and FIG. 3, in performing the photoalignment on the alignment material layer to form the alignment film 200, for example, the alignment light passes through a portion of the alignment material layer in the display region AA and directly irradiates a portion of the photosensitive layer 300; the portion of the photosensitive layer 300 that may be directly irradiated by the alignment light is generally sandwiched between the base substrate 800 and another substrate (e.g., an opposite substrate of a liquid crystal display panel or a package cover of an organic light-emitting display panel) that is opposite to the base substrate 800, therefore, due to the protective effect of the base substrate 800 and the another substrate, the water vapor does not permeate via the portion of the photosensitive layer 300 that may be directly irradiated by the alignment light even if the portion of the photosensitive layer 300 that may be directly irradiated by the alignment light is damaged after light irradiation.

Further, the edge of the photosensitive layer 300 faces the peripheral region PA and is not protected by the base substrate 800 and the another substrate, so if the edge is damaged, water vapor permeates via the damaged edge. According to the embodiments of the present disclosure, the alignment light passing through the alignment material layer is absorbed and/or reflected by the insulating layer 700 without reaching the peripheral circuit 100, and thus is not reflected by the peripheral circuit 100 to the photosensitive layer 300 (for example, the planarization layer), so the edge of the photosensitive layer 300 is not affected by the alignment light, thereby ensuring the good sealing performance and preventing the permeation of the water vapor.

For example, the insulating layer 700 completely absorbs the alignment light passing through the alignment material layer, so as to prevent the alignment light from reaching the peripheral circuit 100.

For example, the insulating layer 700 completely reflects the alignment light passing through the alignment material layer, so as to prevent the alignment light from reaching the peripheral circuit 100.

For example, the insulating layer 700 absorbs one portion of the alignment light and reflects the other portion of the alignment light, thereby preventing the alignment light from reaching the peripheral circuit. For example, as shown in FIGS. 2 and 3, the insulating layer 700 includes an insulating base 710 and a reflective structure 720 that a surface of the insulating base 710 is formed with. The insulating base 710 absorbs one portion of the alignment light, and the reflective structure 720 reflects the other portion of the alignment light. By combining the insulating base 710 with the reflective structure 720, it is possible to better prevent the alignment light from reaching the peripheral circuit 100.

In the embodiments of the present disclosure, the structure of the reflective structure 720 is not specifically limited. For example, in the example shown in FIG. 2, the reflective structure 720 includes a recess in the surface of the insulating base 710. For example, a plurality of the recesses are provided. After the alignment light passes through the alignment material layer and reaches the insulating layer 700, one portion of the alignment light enters the recess and is reflected by a surface of the recess, and the other portion of the alignment light is directly absorbed by the insulating base 710. For example, in the example shown in FIG. 3, the reflective structure includes a protrusion on the surface of the insulating base 710. For example, a plurality of the protrusions are provided. After the alignment light passes through the alignment material layer and reaches the insulating layer, one portion of the alignment light is reflected by the protrusion, and the other portion of the alignment light is directly absorbed by the insulating base 710.

For example, the photoalignment is performed on the alignment material layer by using ultraviolet light to form the alignment film 200, therefore, the insulating layer 700 absorbs the ultraviolet light, further, the insulating layer 700 absorbs light having a wavelength being not less than a wavelength of the ultraviolet light.

For example, the insulating layer 700 is formed of a red color filter material. For example, as shown in FIG. 2, the display region AA further includes a red color filter layer 900 to achieve red display. In this case, the insulating layer 700 and the red color filter layer 900 are formed of the same red color filter material and are in a same layer to simplify the manufacturing process.

For example, as shown in FIG. 2 and FIG. 3, a display circuit 400 is further in the display region AA, and the photosensitive layer 300 covers the display circuit 400 to protect the display circuit 400. In this case, for example, the photosensitive layer 300 is a planarization layer, that is, on the base substrate 800, an upper surface of the photosensitive layer 300 is in the same plane. For example, the display circuit 400 includes: a gate pattern layer on the base substrate, a gate insulating layer on the gate pattern layer, an active pattern layer and a common electrode layer which are on the gate insulating layer, a source/drain pattern layer on the active pattern layer, which is not limited in this embodiment of the present disclosure. For example, other components may or may not be formed on the photosensitive layer 300, and limitations are not imposed in the embodiments of the present disclosure. For example, a pixel electrode (not shown) is on the photosensitive layer 300, and the pixel electrode is connected with the source/drain pattern layer through a via hole in the photosensitive layer 300.

Figure 4:
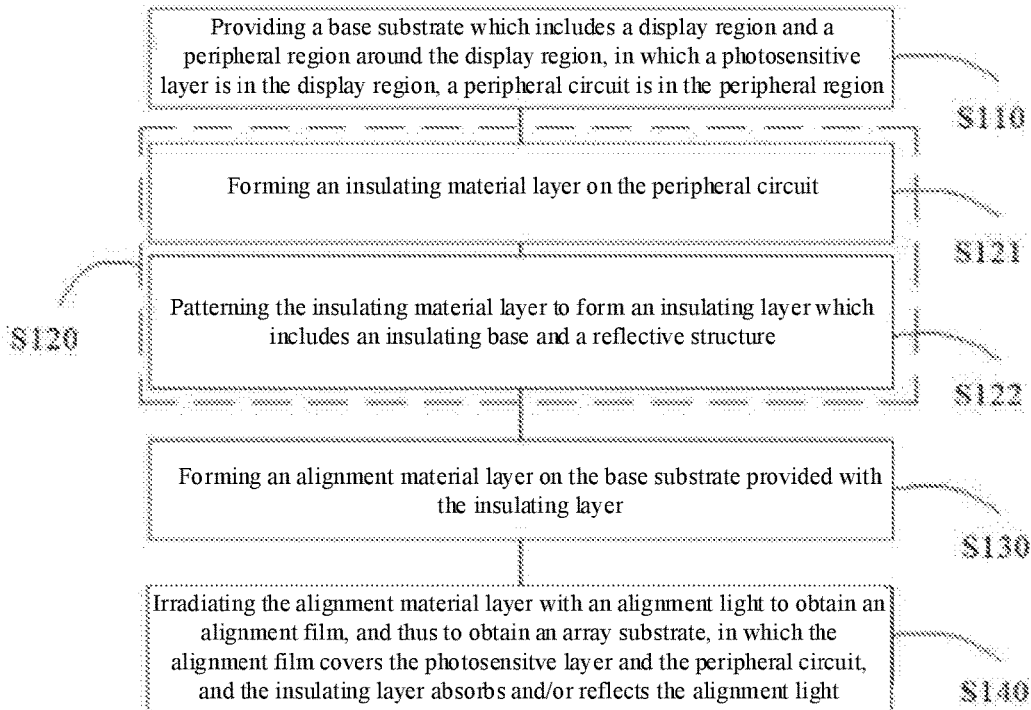
FIG. 4 is a flow chart of a manufacturing method of the array substrate according to the embodiments of the present disclosure.

According to the embodiments of the present disclosure, a manufacturing method of the array substrate is provided. Referring to FIG. 2 to FIG. 4, the manufacturing method includes the following steps.

In a step S110, the base substrate 800 is provided. The base substrate 800 includes the display region AA and the peripheral region PA around the display region AA, the photosensitive layer 300 is in the display region AA, and the peripheral circuit 100 is in the peripheral region PA.

In a step S120, the insulating layer 700 is formed on the peripheral circuit 100.

In a step S130, the alignment material layer is formed on the base substrate 800 on which the insulating layer 700 is formed.

In a step S140, the alignment film 200 is obtained by irradiating the alignment material layer with the alignment light, and thus the array substrate is obtained. The alignment film 200 covers the photosensitive layer and the peripheral circuit, and the insulating layer 700 absorbs and/or reflects the alignment light.

The above manufacturing method is used to manufacture the above array substrate provided by the embodiments of the present disclosure.

Because the insulating layer 700 is provided on the peripheral circuit 100 in the step S120, the alignment light is absorbed and/or reflected by the insulating layer 700 after passing through the alignment material layer in the step S140, the alignment light does not reach the peripheral circuit 100, and thus is not reflected by the peripheral circuit 100 to the edge of the photosensitive layer 300, such as the planarization layer, thereby ensuring the completeness of the edge of the photosensitive layer 300. The photosensitive layer 300 with the edge that is complete has a good sealing property, and the water vapor does not cause corrosion of the display circuit 400 below the photosensitive layer 300. Therefore, the array substrate obtained by the method provided by the embodiments of the present disclosure does not have defects such as the photo frame mura.

In the embodiments of the present disclosure, there are no specific limitations on the step S140. For example, the step S140 includes: providing a polarizer 600 on the alignment material layer and irradiating the polarizer 600 with an ultraviolet light source 500 to obtain the alignment film 200.

For example, the base substrate 800 is a flexible substrate or a rigid substrate. A material of the flexible substrate is, for example, any one of a polycarbonate resin, an acrylic resin, a vinyl chloride resin, a polyethylene terephthalate resin, a polyimide resin, a polyester resin, an epoxy resin, a silicone resin, a fluorine resin and the like. A material of the rigid substrate is, for example, any one of glass, metal, ceramic and the like.

For example, the insulating layer 700 only reflects the alignment light or only absorbs the alignment light. For example, in the examples shown in FIG. 2 and FIG. 3, the insulating layer 700 absorbs one portion of the alignment light and reflects the other portion of the alignment light. Correspondingly, for example, the step S120 includes the following steps.

In a step S121, an insulating material layer is provided on the peripheral circuit 100.

In a step S122, the insulating material layer is patterned to obtain the insulating layer 700. The insulating layer 700 includes the insulating base 710 and the reflective structure 720, the insulating base 710 is configured to absorb one portion of the alignment light, and the reflective structure 720 is configured to reflect the other portion of the alignment light.

For example, the reflective structure 720 includes the recess formed in the surface of the insulating base 710; or the reflective structure 720 includes the protrusion formed on the surface of the insulating base 710.

In the embodiments of the present disclosure, there are no specific limitations on the material for forming the insulating layer 700. For example, the insulating layer 700 is formed of the red color filter material.

For example, the light source 500 is the ultraviolet light source, and for example, the ultraviolet light source 500 emits ultraviolet light having a wavelength of 350 nm to 400 nm. For example, the red color filter material absorbs light having a wavelength of less than 620 nm, and thus absorbs the ultraviolet light.

Because the red color filter material is an organic resin, after coating the red color filter material to form a red color filter material layer, it is only necessary to expose and develop the red color filter material layer to obtain the insulating layer 700 shown in FIG. 2 and FIG. 3.

For example, the red color filter material layer formed in the peripheral region is exposed by using a halftone mask.

According to the embodiments of the present disclosure, a display panel is further provided, and the display panel includes the array substrate according to the embodiments of the present disclosure as described above.

According to the embodiments of the present disclosure, because the insulating layer 700 is formed between the peripheral circuit 100 and the alignment film 200, in performing the photoalignment on the alignment material layer to form the alignment film 200, the alignment light is absorbed and/or reflected by the insulating layer 700 without reaching the peripheral circuit 100. Thus, the alignment light is not reflected by the peripheral circuit 100 to the edge of the photosensitive layer 300, so as to ensure that the photosensitive layer 300 is complete, prevent the water vapor from corroding the display circuit 400 and thereby prevent the photo frame mura caused by the corrosion of the display circuit 400 by the water vapor. That is, the display panel has a high yield.

For example, the display panel is a liquid crystal display panel. In this case, the display panel further includes an opposite substrate that is bonded with the array substrate. In order to realize color display, the array substrate or the opposite substrate is provided with a color filter layer.

For example, the insulating layer 700 is formed of the red color filter material. In this case, in the situation where the array substrate is provided with the color filter layer, the insulating layer 700 is formed simultaneously with the red color filter layer 900 that is included in the color filter layer, to simplify the manufacturing process.

According to the embodiments of the present disclosure, a display device is further provided, and the display device includes the display panel according to the embodiments of the present disclosure as described above.

The display device does not generate defects such as the photo frame mura during displaying. Because the alignment film is obtained by a method of photoalignment, the display device has advantages of high aperture ratio, high contrast, fast response, and the like. In addition, in the display device, because the photosensitive layer 300 maintains good completeness, the insulating property of the photosensitive layer 300 is ensured, and an undesired short circuit between electrical components is prevented.

What are described above is related to the illustrative embodiments of the disclosure only and not limitative to the scope of the disclosure; the scopes of the disclosure are defined by the accompanying claims.

What is claimed is:

1. An array substrate, comprising a display region and a peripheral region around the display region,
   wherein a photosensitive layer is in the display region, a peripheral circuit is in the peripheral region, the array substrate further comprises an alignment film, and the alignment film covers the photosensitive layer and the peripheral circuit,
   wherein the array substrate further comprises an insulating layer that is between the peripheral circuit and the alignment film, the alignment film is a photo alignment film, and the insulating layer is configured to absorb and/or reflect an alignment light adopted for performing photoalignment to obtain the alignment film, and
   wherein the insulating layer comprises an insulating base and a reflective structure that a surface of the insulating base is provided with, the insulating base is configured to absorb one portion of the alignment light, and the reflective structure is configured to reflect the other portion of the alignment light.

2. The array substrate according to claim 1, wherein the reflective structure comprises a recess in the surface of the insulating base; or the reflective structure comprises a protrusion on the surface of the insulating base.

3. The array substrate according to claim 1, wherein the insulating layer is formed of a red color filter material.

4. The array substrate according to claim 3, wherein the display region further comprises a red color filter layer, and the insulating layer and the red color filter layer are in a same layer and are formed of a same red color filter material.

5. The array substrate according to claim 1, wherein the insulating layer is in the peripheral region only.

6. The array substrate according to claim 1, wherein the display region is further provided with a display circuit, the photosensitive layer covers the display circuit and the photosensitive layer is a planarization layer.

7. A display panel, comprising the array substrate according to claim 1.

8. A display device, comprising the display panel of claim 7.

9. A manufacturing method of an array substrate, comprising:
   providing a base substrate comprising a display region and a peripheral region around the display region, wherein a photosensitive layer is in the display region, and a peripheral circuit is in the peripheral region;
   forming an insulating layer on the peripheral circuit;
   forming an alignment material layer on the base substrate provided with the insulating layer; and
   obtaining an alignment film by irradiating the alignment material layer with an alignment light, wherein the alignment film covers the photosensitive layer and the peripheral circuit, and the insulating layer absorbs and/or reflects the alignment light.

10. The manufacturing method according to claim 9, wherein the forming the insulating layer on the peripheral circuit comprises:
    forming an insulating material layer on the peripheral circuit;
    patterning the insulating material layer to obtain the insulating layer, wherein the insulating layer comprises an insulating base and a reflective structure, the insulating base is configured to absorb one portion of the alignment light, and the reflective structure is configured to reflect the other portion of the alignment light.

11. The manufacturing method according to claim 10, wherein the reflective structure comprises a recess in a surface of the insulating base; or the reflective structure comprises a protrusion on the surface of the insulating base.

12. The manufacturing method according to claim 9, wherein the insulating layer is formed of a red color filter material.

13. The manufacturing method according to claim 12, wherein the display region further comprises a red color filter layer, and the insulating layer and the red color filter layer are formed simultaneously.

14. The manufacturing method according to claim 9, wherein the insulating layer is in the peripheral region only.

15. The manufacturing method according to claim 9, wherein the display region is further provided with a display circuit, the photosensitive layer covers the display circuit and the photosensitive layer is a planarization layer.

* * * * *